(12) United States Patent
Stowell et al.

(10) Patent No.: US 7,985,463 B2
(45) Date of Patent: Jul. 26, 2011

(54) LOW COST ANTENNA ARRAY FABRICATION TECHNOLOGY

(75) Inventors: William Randolph Stowell, Rising Sun, IN (US); Michael R. Steele, Loveland, OH (US); Thomas Walter Rentz, Cincinnati, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/401,470

(22) Filed: Mar. 10, 2009

(65) Prior Publication Data

US 2009/0169835 A1 Jul. 2, 2009

Related U.S. Application Data

(63) Continuation-in-part of application No. 11/272,166, filed on Nov. 10, 2005, now Pat. No. 7,510,668.

(51) Int. Cl.
*B41M 5/00* (2006.01)
*B44C 1/17* (2006.01)
*G03G 7/00* (2006.01)

(52) U.S. Cl. ....... 428/195.1; 428/914; 216/43; 216/100; 427/149; 156/230

(58) Field of Classification Search ............... 428/195.1, 428/914; 216/41, 43, 44, 96, 100, 105; 427/149; 156/230
See application file for complete search history.

(56) References Cited

U.S. PATENT DOCUMENTS

| | | | |
|---|---|---|---|
| 4,835,087 A | 5/1989 | Bielli et al. | |
| 4,969,257 A | 11/1990 | Sato et al. | |
| 5,453,328 A | 9/1995 | Nagano et al. | |
| 5,455,116 A * | 10/1995 | Nagano et al. | 428/545 |
| 6,020,862 A | 2/2000 | Newton et al. | |
| 6,083,767 A | 7/2000 | Tjaden et al. | |
| RE38,059 E | 4/2003 | Yano et al. | |
| 6,598,208 B2 | 7/2003 | Sasaki et al. | |
| 6,623,817 B1 | 9/2003 | Yang et al. | |
| 6,697,694 B2 * | 2/2004 | Mogensen | 700/119 |
| 6,771,226 B1 | 8/2004 | Dujmovic | |
| 6,898,779 B2 | 5/2005 | Juengling | |
| 2002/0129488 A1 | 9/2002 | Lieberman | |
| 2003/0029830 A1 * | 2/2003 | Takaya et al. | 216/13 |
| 2003/0163794 A1 | 8/2003 | Horie et al. | |
| 2005/0015175 A1 | 1/2005 | Huang | |
| 2005/0120321 A1 | 6/2005 | Auracher et al. | |

FOREIGN PATENT DOCUMENTS

| | | |
|---|---|---|
| DE | 3429865 A1 | 2/1986 |
| DE | 3740149 A1 | 6/1989 |
| DE | 10315459 A1 | 10/2004 |
| GB | 829354 A | 3/1960 |
| JP | 59031870 A | 2/1984 |

OTHER PUBLICATIONS

"Prototype Printed Circuit Production" IBM Technical Disclosure Bulletin, IBM Corp. New York, US, vol. 31, No. 8, Jan. 1989.

* cited by examiner

*Primary Examiner* — Mark Ruthkosky
*Assistant Examiner* — David J Joy
(74) *Attorney, Agent, or Firm* — McNees Wallace & Nurick LLC

(57) ABSTRACT

Methods are provided for producing large volumes of small antenna arrays. In one embodiment, the method comprises the steps of creating an antenna array pattern as a computer file, printing the created pattern onto the surface of a suitable transfer paper, placing the printed image surface in contact with the surface of a material to be etched, and transferring the printed image to the surface of the material to be etched. The transfer can be effected by any combination of chemicals, heat, and/or pressure. After transfer of the printed image, the transfer paper is removed. The step of removing the transfer paper optionally includes wetting the transfer paper in a manner that dissolves the transfer paper leaving the printed antenna pattern on the surface of the material to be etched. The method further includes the step of etching the non-printed portions of the material, preferably by chemical etching, and removing the printed pattern from the surface of the material to yield an antenna array comprising a non-etched portion of the substrate surface. Arrays, and substrates having an etch-resistant mask for making the arrays, are also provided.

5 Claims, 2 Drawing Sheets

LOW COST ANTENNA ARRAY FABRICATION TECHNOLOGY

CROSS REFERENCE TO RELATED APPLICATIONS

This application is a divisional of U.S. patent application Ser. No. 11/272,166, now U.S. Pat. No. 7,510,668, filed Nov. 10, 2005, which is incorporated by reference in its entirety.

FIELD OF THE INVENTION

The present invention is directed to fabrication of microwave antenna elements, and particularly to fabrication of such antenna arrays, such as for use in aircraft applications.

BACKGROUND OF THE INVENTION

It is known that antenna arrays have a wide range of applications. They are commonly used in items as diverse as cell phones, aircraft radio and radar systems. Antenna arrays are used to provide directional transmission of an electromagnetic signal as well as to enhance electronic signal recognition. It is known to incorporate antenna arrays into aircraft components, such as microwave antenna arrays. Such arrays can be incorporated into the external surfaces of aircraft assemblies, such as, for example, the fuselage, wings, tail, and other low temperature assemblies.

Known methods to produce antenna arrays utilize photo-etching technology. Exemplary prior art methods of photo-etching are briefly described U.S. Pat. No. 6,083,767, for example. In such known methods, an image of the desired design is focused on a metallic surface (or other material desired for the antenna) that is covered with photoresist. The photoresist is then developed, leaving the desired pattern of resist to protect areas of the surface intended to become the antenna array. The surface is etched using a suitable etchant in order to remove the unprotected surfaces. Finally, the photoresist material that protected the antenna array design during the etching process is removed.

However, known methods such as the above-described photoresist methodology are not suitable for high-volume production of small antenna arrays, due to the complexity and labor-intensive steps involved. Therefore, there exists an unmet need for simple and inexpensive methods of fabricating large volumes of small antenna arrays.

SUMMARY OF THE INVENTION

The present invention provides simple, cost-effective methods for producing large volumes of small antenna arrays, such as microwave antenna arrays. The invention further provides an etchable substrate having a non-etchable mask formed by transferring a printed image from a transfer paper onto the etchable surface of the substrate.

In one embodiment, the method comprises the steps of creating an antenna array pattern as a computer file, printing the created pattern as a printed image on the first surface of a suitable transfer paper, placing the printed image in contact with the surface of a substrate material to be etched, applying pressure and heat to the side of the transfer paper opposite the first surface sufficient to transfer the printed image to the surface of a material to be etched, and removing the transfer paper while leaving the transferred printed image on the surface of the material to be etched. Preferably, the step of removing the transfer paper includes wetting the transfer paper in a manner that dissolves the transfer paper while leaving the transferred printed antenna pattern on the surface of the substrate material undisturbed.

Optionally, the methods further include the steps of etching the non-printed portions of the substrate material, preferably by chemical etching, and removing the printed pattern from the surface of the substrate material to yield an unetched pattern on the surface of the substrate.

The apparatus of the present invention comprises a substrate having an etchable surface, and a non-etchable mask adhered to at least a portion of the etchable surface. The mask comprises a printed image of an antenna array pattern, the printed image created and applied by the process of creating an antenna array pattern, printing the antenna array pattern onto the first surface of a transfer paper, placing the first surface of the transfer paper in contact with the etchable surface of the substrate, transferring the printed image to the etchable surface of the substrate, and removing the transfer paper in a manner that leaves the printed image on the etchable surface of the substrate. The transferred printed image acts as a mask during etching, and then is removed to reveal the unetched surface that was protected by the mask.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

The present invention comprises methods for providing a plurality of discrete antenna arrays on the surface of a material. The invention further provides etchable substrates having a non-etchable mask adhered to a surface of the substrate.

Figure 1:
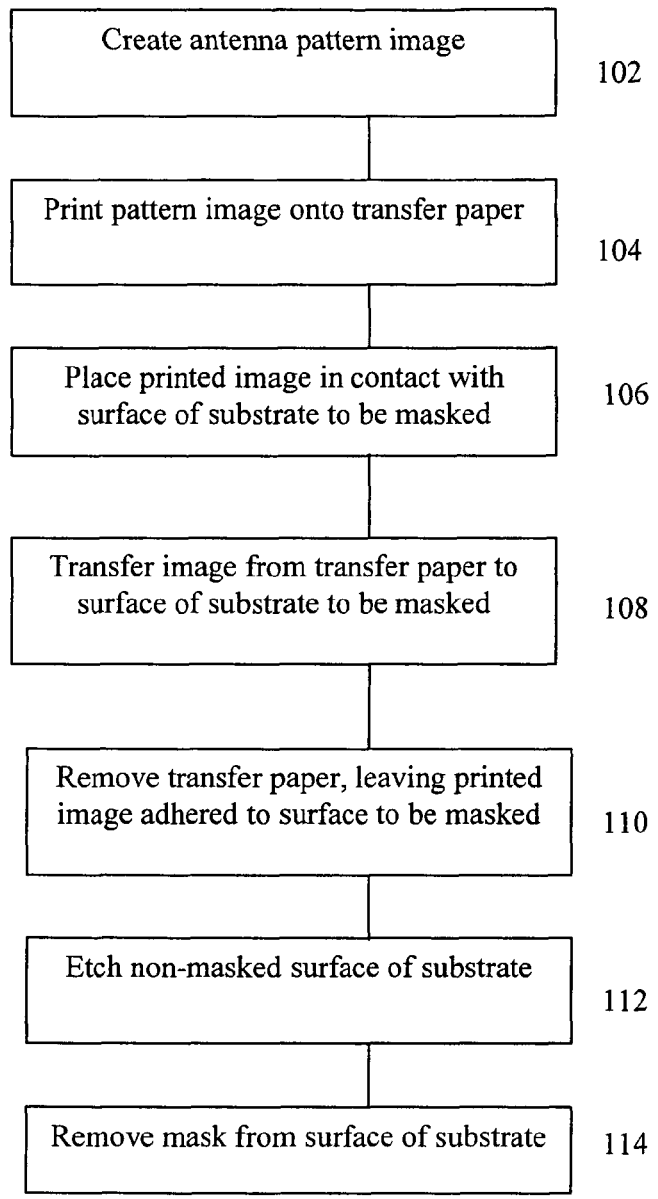
FIG. 1 illustrates a flow chart of the method of the invention in accordance with a first embodiment.
Figure 2:
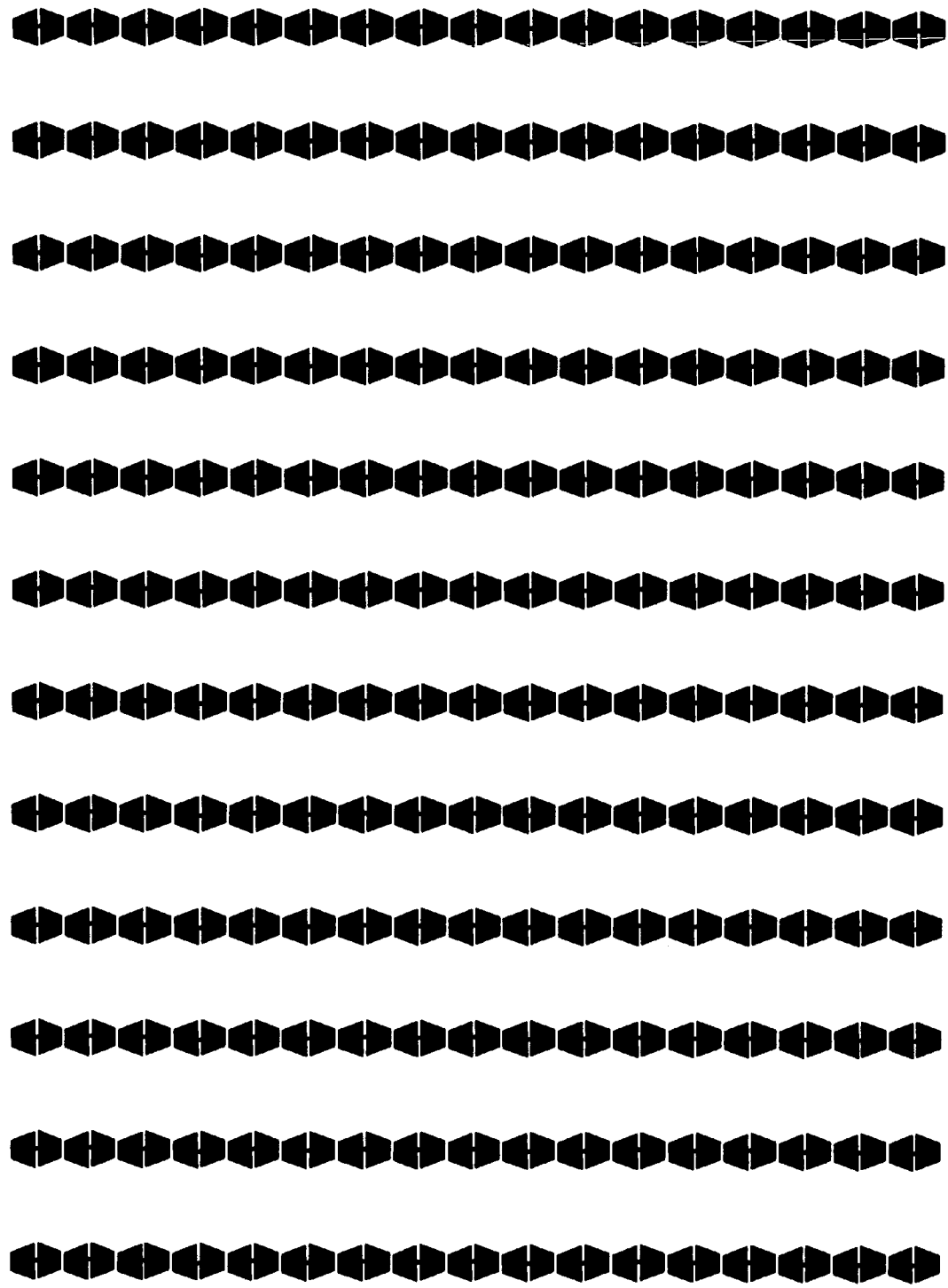
FIG. 2 illustrates a printed array pattern in accordance with the present invention.

In one embodiment shown in FIG. 1, the method commences with the step 102 of creating and saving an image, such as a desired antenna array pattern, as a computer file, preferably by using Computer-Aided Design ("CAD") software such as AUTOCAD® software or other suitable CAD program. AUTOCAD® is a registered trademark for computer software owned by Autodesk, Inc. (a Delaware corporation having a place of business at 111 McInnis Parkway San Rafael, Calif. 94903. An exemplary image comprising an antenna array pattern is illustrated in FIG. 2.

The created and saved image is then recalled from memory storage, and is sent to a printer for printing onto the surface of a suitable transfer paper in step 104. The step of printing 104 is preferably made using a conventional computer-controlled printer such as a laser jet printer or inkjet printer that utilizes a toner or other non-etchable media to produce an image. However, the method can utilize any printer that will deposit a toner and/or other non-etchable print media that is transferable and suitable as a masking agent when transferred to the surface of an etchable substrate.

In step 106, the printed transfer paper is placed with the printed pattern facing the surface of the substrate or other material to be etched. In step 108, the printed image is transferred to the substrate. Depending upon the printer toner selection and transfer paper selection, any combination of chemicals, pressure and/or heat can be applied to transfer the printed image and cause the printed image to adhere to the surface of the material to be etched. Preferably, step 108 involves applying only pressure and/or heat. Such pressure and/or heat can be applied by any known means, but are preferably applied by means of an autoclave, an iron, or a steam source. Preferably, the heat is dry heat, such as from a hot dry iron. The applied heat and pressure cause the printed image to transfer onto the surface of the material to be etched.

In step 110, the transfer paper is removed, leaving the printed image adhered to the surface of the material to be etched. In one embodiment of step 110, water or other solvent compatible with the transfer paper and print media is applied to the surface of the transfer paper opposite the printed image side. Application of water separates the transfer paper backing from the printed image, allowing the transfer paper to be removed while leaving the printed antenna pattern adhered onto the surface of the material to be etched. This adhered pattern acts as a physical and chemical mask to protect the underlying surface of the etchable substrate. In any subsequent etching processes, the printed image masks the underlying surface, yet does not interfere with etching of adjacent unmasked portions of the substrate.

In step 112, the material is etched, preferably by chemical etching using commercially available etching chemicals and processes. After etching, in step 114 the printed image mask is cleaned from the surface of the etchable substrate using acetone or other suitable solvent.

The process described herein makes it feasible to design and fabricate antenna arrays in a very short period of time, using inexpensive equipment to create a masked substrate that can be etched to yield an array. After the design has been made and stored in a computer file, it takes only minutes to produce the pattern on transfer paper, minutes to transfer the pattern onto a suitable substrate and minutes to etch the pattern.

EXAMPLES

The methods of the present invention have been found compatible with the etching of antenna arrays onto copper clad kapton, as well as onto copper clad circuit board material. For example, in one embodiment, the exemplary antenna array pattern image of FIG. 1 was created as an AUTOCAD® file on a microprocessor controlled computer. The created pattern image was then saved into memory where it was recalled and sent to a printer for printing as a printed image onto a suitable transfer paper. In this example, the printer used was an Hewlett-Packard Laser Jet 2300dn, with standard ink as provided in commercially available Hewlett-Packard ink cartridge model Q2610A. The transfer paper used was DECAFIX® brand transfer paper. DECAFIX® is the trademark for decalcomania papers, particularly proprietary transfer papers of the waterslide variety. The DECAFIX® trademark is believed to be owned by Brittains Tullis Russell, Inc. Corporation, with a business address of 500 Summer Street, Stamford, Conn., USA, based upon trademark registration data available on the USPTO website. DECAFIX® and other decalcomania papers are most commonly used for the production and transfer application of decals for models and toys. Such papers are specially designed to give improved adhesion on difficult surfaces to decorate, such as plastics and coated articles. The manufacturer's specifications for the selected transfer paper in this example are set forth as Table 1 below:

TABLE 1

| Decafix (High Quality Waterslide Transfer Paper) PRODUCT SPECIFICATION | |
|---|---|
| Nominal Substance: | 176 gsm |
| Nominal Gum Coat: | 6.5 gsm |
| Nominal Caliper: | 188 µm |
| Moisture Content: | In equilibrium with 50-60% RH |
| Base Paper: | Specially formulated twinwire paper |
| Release Time: | Less than 60 seconds |
| Adhesive: | A high quality adhesive for application to plastic, wood and coated metals |

In this example, the image created using AUTOCAD® software was printed directly to the DECAFIX® transfer paper using an inkjet printer and commercially available inkjet ink. The resulting printed image was then transferred to a copper clad substrate using heat and pressure. Transfer was effected using a hot dry electrical iron set to about 180 degrees F. and a pressure in the range of between about 2 to about 10 psi. However, transfers can also be effected using an autoclave and/or vacuum bagging the copper clad substrate so that the substrate surface remains in contact with the printed image on the transfer paper. In one example, the autoclave was ramped from room temperature to 300 degrees F. at a rate of about 2 to about 5 degrees F. per minute, with the vacuum pressure in the range of about 15 to about 25 psi. In this example, after reaching the 300 degree F. temperature, the temperature and pressure were maintained for 10 to 30 minutes, then the autoclave was cooled and the pressure released.

Following the pressure/thermal transfer process, the exposed back of the transfer paper was soaked with water for between about 5 to about 10 minutes. After the soak, the transfer paper was easy to remove by sliding it away from the substrate, leaving behind the pattern which had been originally printed onto the transfer paper by the laser jet printer. The printed pattern left on the copper clad substrate adhered strongly and became an etch-resistant mask after drying.

The resulting copper clad substrate with the pattern was subsequently immersed in a ferric chloride copper etch solution. Ferric chloride and other available etching chemical solutions are widely commercially available, and all are believed to be compatible with the present invention. Using ferric chloride in the present example, after about ½ to 2 hours of etching, the unwanted copper was removed from the substrate surface, leaving only the printed and transferred pattern that was protecting the copper underneath it. After rinsing the etch solution off the substrate, a cloth dipped in acetone was used to wipe the printed image to reveal the desired copper pattern on the substrate surface.

Using the methods of the present invention, it is possible to easily mask a desired portion of an etchable substrate, thereby allowing for subsequent etching of the surrounding unmasked surface of the substrate without damaging the masked substrate surface.

While the invention has been described with reference to a preferred embodiment, it will be understood by those skilled in the art that various changes may be made and equivalents may be substituted for elements thereof without departing from the scope of the invention. For example, the present invention is not limited to etching of copper-clad materials, and can be used to transfer printed images onto any compatible rigid or semi-rigid etchable substrate material that is suitable to function as an antenna array. Use of other metals such as silver, tin, gold, iron, nickel, cobalt, combinations thereof, as well as alloys containing those metals, is also within the scope of the invention.

In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. An etchable substrate having an etchable surface thereon comprising:
   a mask adhered to at least a portion of the etchable surface, the mask comprising a printed image, wherein the mask is created and applied by the process of:
     creating an image comprising a pattern;
     printing the image onto the first surface of a transfer paper;
     placing the first surface of the transfer paper in contact with the etchable surface of the substrate;
     transferring the printed image to the etchable surface of the substrate; and
     removing the transfer paper in a manner that leaves the printed image adhered to the etchable surface of the substrate;
   wherein the transfer paper is a waterslide transfer paper.

2. The etchable substrate of claim 1, wherein the mask comprises toner from a computer printer.

3. The etchable substrate of claim 1, wherein the etchable surface comprises copper.

4. The etchable substrate of claim 1, wherein the printed image is an antenna array pattern.

5. An etchable substrate having an etchable surface thereon comprising:
   a mask adhered to at least a portion of the etchable surface, the mask comprising a printed image, wherein the mask is created and applied by the process of:
     creating an electronic image using computer-aided design software, the image comprising an antenna array pattern;
     printing the image onto a first surface of a transfer paper;
     placing the first surface of the transfer paper in contact with the etchable surface of the substrate;
     transferring the printed image to the etchable surface of the substrate; and
     removing the transfer paper in a manner that leaves the printed image adhered to the etchable surface of the substrate;
   wherein the transfer paper is a waterslide transfer paper.

* * * * *